United States Patent
Stellari et al.

(10) Patent No.: US 11,508,438 B1
(45) Date of Patent: Nov. 22, 2022

(54) RRAM FILAMENT LOCATION BASED ON NIR EMISSION

(71) Applicant: International Business Machines Corporation, Armonk, NY (US)

(72) Inventors: Franco Stellari, Waldwick, NJ (US); Takashi Ando, Eastchester, NY (US); Cyril Cabral, Jr., Yorktown Heights, NY (US); Eduard Albert Cartier, New York, NY (US); Martin Michael Frank, Dobbs Ferry, NY (US); Peilin Song, Lagrangeville, NY (US); Dirk Pfeiffer, Croton on Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 17/072,810

(22) Filed: Oct. 16, 2020

(51) Int. Cl.
  *G11C 11/00* (2006.01)
  *G11C 13/00* (2006.01)

(52) U.S. Cl.
  CPC ................ *G11C 13/0069* (2013.01)

(58) Field of Classification Search
  CPC .................................... G11C 13/0069
  USPC ....................................... 365/148
  See application file for complete search history.

(56) References Cited

U.S. PATENT DOCUMENTS 7,936,583 B2 * 5/2011 Khoury ............... G11C 11/1675
  365/158
8,227,896 B2 * 7/2012 Jiang ..................... G11C 17/165
  365/225.5
2010/0065836 A1 * 3/2010 Lee ..................... H01L 45/1273
  257/536

FOREIGN PATENT DOCUMENTS

CN         107195777 B       4/2019

OTHER PUBLICATIONS

Lv et al. "Atomic View of Filament Growth in Electrochemical Memristive Elements." Scientific Reports, www.nature/scientificreports, DOI:10.1038/srep13311.Received May 21, 2015, Accepted Jul. 20, 2015, Published Aug. 21, 2015. Sci Rep 5, 13311. 8 pages.

Niu et al. "Geometric Conductive Filament Confinement by Nanotips for Resistive Switching of Hfo2-RRAM Devices with High Performance." Scientific Reports, www.nature/scientificreports, DOI:10.1038/srep25757.Received Jun. 5, 2015, Accepted Apr. 22, 2016, Published May 16, 2016. Sci Rep 6, 25757. 9 pages.

Yalon et al. "Spatially Resolved Thermometry of Resistive Memory Devices." Scientific Reports, www.nature/scientificreports, DOI: 10.1038/s41598-017-14498-3. Received Jun. 6, 2017, Accepted Oct. 11, 2017, Published Nov. 10, 2017. Sci Rep 7, 15360. 8 pages.

List of IBM Patents or Patent Applications Treated as Related, dated Dec. 3, 2021, 2 pages.

* cited by examiner

*Primary Examiner* — Vu A Le

(74) *Attorney, Agent, or Firm* — Scully, Scott, Murphy & Presser, P.C.; Daniel P. Morris

(57) ABSTRACT

Methods and systems for locating a filament in a resistive memory device are described. In an example, a device can acquire an image indicating an occurrence of photoemission from the resistive memory device. The device can determine a location of the filament in a switching medium of the resistive memory device using the acquired image.

20 Claims, 7 Drawing Sheets

US 11,508,438 B1

RRAM FILAMENT LOCATION BASED ON NIR EMISSION

STATEMENT REGARDING FEDERALLY SPONSORED RESEARCH OR DEVELOPMENT

This invention was made with Government support under Contract No.: FA8650-18-F-1656 ATC-TSS-DTE awarded by Air Force Research Laboratory. The Government has certain rights in this invention.

BACKGROUND

The present disclosure relates in general to systems and methods that can locate a conductive filament being formed in resistive random access memory (RRAM) devices.

A resistive random access memory (RRAM) device includes a switching medium situated between two electrodes. Conductive filaments can be formed between the two electrodes to provide a conducting path between the electrodes. The filaments can be formed by applying an appropriate amount of voltage to the RRAM device.

SUMMARY

In some examples, a method for locating a filament in a resistive memory device is generally described. The method can include acquiring an image indicating an occurrence of photoemission from the resistive memory device. The method can further include determining a location of the filament in a switching medium of the resistive memory device using the acquired image.

In some examples, a system for locating a filament in a resistive memory device is generally described. The system can include a memory and a processor. The memory can be configured to store a set of instructions. The processor can be configured to be in communication with the memory. The processor can be configured to acquire an image indicating an occurrence of photoemission from the resistive memory device. The processor can be further configured to determine a location of the filament in a switching medium of the resistive memory device using the acquired image.

In some examples, an apparatus for locating a filament in a resistive memory device is generally described. The apparatus can include an optical device and a controller. The optical device can be configured to generate an image indicating an occurrence of photoemission on a resistive memory device. The controller can be configured to be in communication with the optical device. The controller can be configured to acquire the image generated by the optical device. The controller can be further configured to determine a location of a filament in a switching medium of the resistive memory device using the acquired image.

Further features as well as the structure and operation of various embodiments are described in detail below with reference to the accompanying drawings. In the drawings, like reference numbers indicate identical or functionally similar elements.

DETAILED DESCRIPTION

A resistive random access memory (RRAM) device can be switched among multiple states, where the states can be characterized by the RRAM device's resistance. In an example, to program the RRAM device, a voltage can be applied to the RRAM device to cause a conductive filament to form in the switching medium or insulating layer. The formation of the filament can cause the RRAM device to switch from a relatively high resistive state (e.g., when the conductive filament is absent), to a relatively low resistive state. In some examples, an erase process can be implemented to reverse the RRAM back to the relatively high resistive state. The changes to the resistive states of the RRAM device can be associated with respective states of a binary bit. Accordingly, RRAM devices can be implemented as memory cells and can be programmed or erased to represent binary states zero or one.

Figure 1:
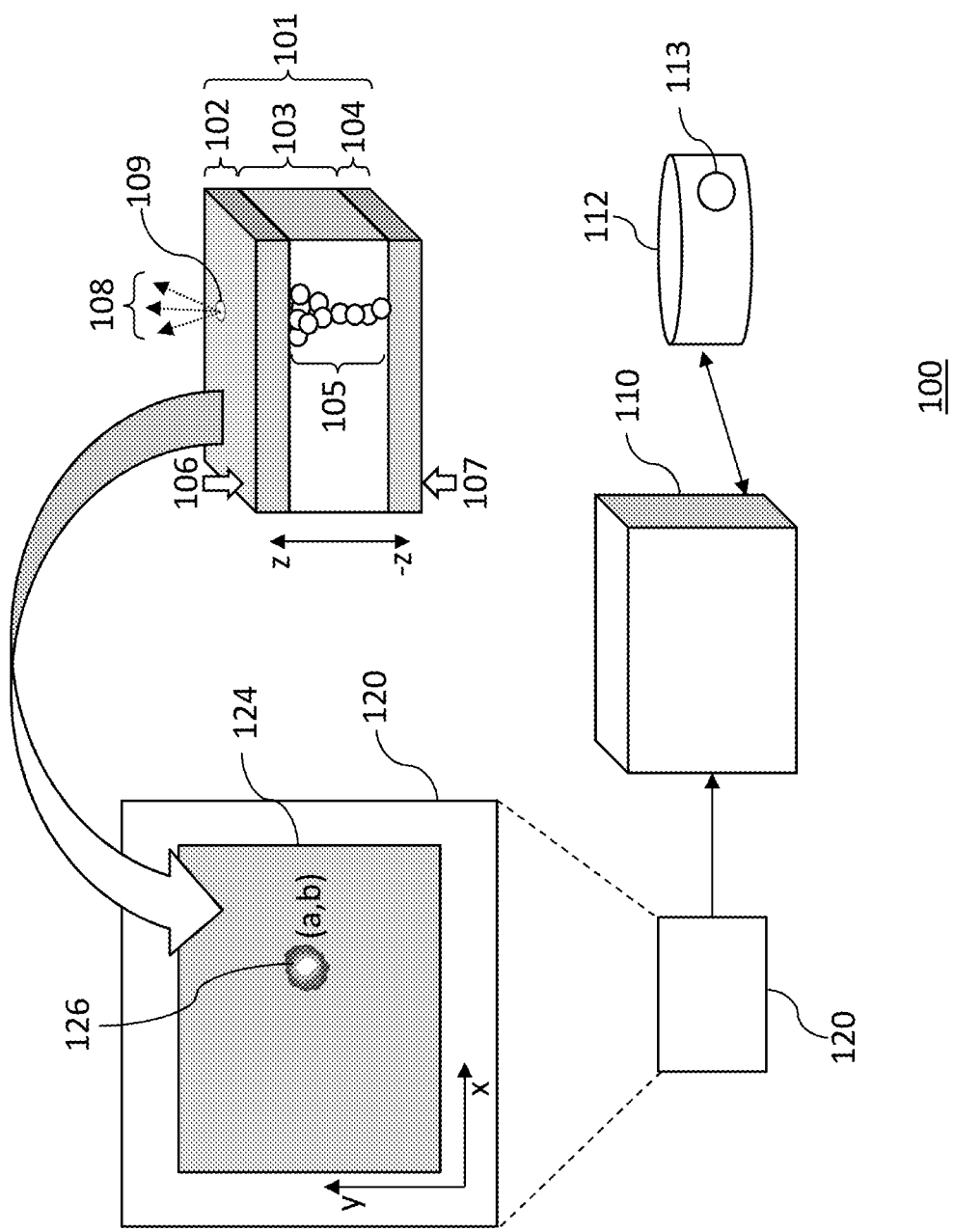
FIG. 1 is a diagram showing an example system that can implement RRAM filament location based on NIR emission in one embodiment.

FIG. 1 is a diagram showing an example system 100 that can implement RRAM filament location based on near infrared (NIR) emission in one embodiment. The system 100 can be implemented in a computing device, such as a computer, a processor, a microprocessor, a controller, a microcontroller, a system on chip (SoC) device, an optical device, a camera, and/or other types of computing devices. The system 100 can include a processor 110 and a memory 112. The processor 110 can be configured to be in communication with the memory 112. In some examples, the memory 112 can be a component of the processor 110, such as being embedded on the processor 110. In some examples, the processor 110 and the memory 112 can be embedded on the same computer chip. The memory 112 can be configured to store a set of instructions 113. The processor 110 can be configured to execute the set of instructions 113 to implement the system 100 to determine a location of a filament being formed in a switching medium of a resistive memory device 101, where the resistive memory device 101 can be a resistive random access memory (RRAM) device.

In an example, the processor 110 can receive or acquire data 120. The data 120 can include image data of an image 124, where the image 124 can be generated by a time-integrated camera such as a near infrared (NIR) camera or NIR microscope. In some embodiments, the camera and microscope may be sensitive to visible, near infrared, mid infrared, or long infrared (thermal) light spectrum. Examples of such cameras include Si-based Charge-Coupled Devices (CCDs), complementary metal-oxide-semiconductor (CMOS) sensors, indium gallium arsenide (InGaAs) camera, MeCdTe (MCT) cameras, indium antimonide (InSb) thermal cameras, Superconducting Single Photon Detectors, etc. The processor 110 can receive the data 120 from another device, such as an NIR camera, an NIR microscope, another computing device, and/or other types of computing or optical devices. The image 124 can be an image of at least a portion of the resistive memory device 101. In the example shown in FIG. 1, the image 124 can be an image of a surface 106 (e.g., top surface) of the resistive memory device 101. In some examples, the image 124 can be an image of another surface 107 (e.g., bottom surface) of the resistive memory device 101, which may be acquired through the substrate of the wafer.

The resistive memory device 101 can include at least a first conductive element or electrode 102, a second conductive element or electrode 104, and a layer of switching medium 103 that can be located or situated between the electrodes 102 and 104. The electrodes 102 and 104 can be made of conductive materials, such as various kinds of metals or alloy including rhodium, titanium, aluminum, copper, tungsten, iridium-ruthenium alloy, and/or other types of metal or conductive materials. The switching element 103 can be a layer of dielectric or insulating materials, such as layered amorphous silicon (a-Si), metal oxides, silicon oxides, Hafnium oxide ($HfO_x$), and/or other types of dielectric materials. It shall be apparent to a person of ordinary skill in the art that other materials can be used for forming the electrodes 102 and 104, and/or the switching medium 103.

In an example, particular amount of voltage and/or current can be applied to the resistive memory device 101 to form a conductive filament (herein "filament") 105 in the switching medium 103. The formation of the filament 105 can cause the switching medium 103 be conductive through a conductive path, such as the filament 105. Further, the formation of the filament 105 can cause the resistive memory device 101 to operate in a low resistance state. The filament 105 can be formed based on different mechanisms, such as vacancy or metal defect migration, and/or other mechanisms. In an example, the resistive memory device 101 can be reset by breaking the filament 105, where breaking the filament 105, or the absence of the filament 105, can switch the resistive memory device 101 to operate in a high resistance state.

In an example, photoemission 108 can occur on one or more surfaces of the resistive memory device 101 in response to the formation of the filament 105. The photoemission 108 can be photoemission of various ranges, such as near-infrared (NIR), mid-infrared, infrared, visible, and/or other ranges. The carriers moving from one electrode to the opposite one (e.g., from element 102 to element 104, or from element 104 to element 102) along the formed or partially-formed filament 105 in the dielectric medium (e.g., switching medium 103) can produce a spontaneous photoemission under certain conditions of device operations, which include voltage across the device and current flowing in the device. The intensity and spectrum of the emission may depend on the bias conditions, for example, higher currents and higher voltages can produce higher emission intensity. In some case, the emission intensity can increase linearly with the current in the cell and exponentially with the applied voltage. The spontaneous photoemission can pass though one of the electrodes (e.g., top electrode or element 102 for front side measurements) and be measured with visible, NIR or thermal cameras or microscopes.

In the example shown in FIG. 1, the image 124 can be an image of the surface 106 after the filament 105 is formed. Based on the formation of the filament 105, the image 124 can include a photoemission intensity map (grey scale of false colors) exclusively or in combination with a photography of the RRAM device (e.g., resistive memory device 101) acquired, for example, by illuminating the sample and measuring the intensity of the reflected light. The photoemission intensity map, acquired in the dark, can allow one to detect the spontaneous emission from the filament 105 during appropriate/controlled bias/operating conditions. The pattern image can allow one to localize the active area of the RRAM device and determine the position of any spontaneous photoemission spot in the image relative to the device geometry, such as the cell center or perimeter. A relatively "bright" photoemission spot ("spot") 126 at a spatial location (a, b) on a 2-dimensioanl image space, such as an x-y plane, shown in FIG. 1. The emission image 124 can include different shades, pixel values, and/or intensity, where the spot 126 can be a visual indicator in the image 124 that indicates the occurrence of the photoemission 108. The location (a, b) of the spot 126 in the image 124 can correspond to the location 109 on the surface 106 of the resistive memory device 101. The processor 110 can receive the data 120 that includes the image 124, and can execute the set of instructions 113 stored in the memory 112 to determine a location where the filament 105 is formed in the switching medium 103. For example, the processor 110 can determine that the photoemission spot 126 is located at the location (a, b) in the image 124, and can determine that the filament 105 is formed in the switching medium 103 below (e.g., in the −z direction shown in FIG. 1) the location 109 of the surface 106. In some examples, the set of instructions 113 can include image processing algorithms such as edge detection, feature extraction, pattern recognition, image filters, and/or other types of image processing algorithms. The processor 110 can be configured to execute one or more of the image processing algorithms among the set of instructions 113 to determine the location of the spot or pattern 126 in the image 124. In some examples, the processor 110 can display a result indicating the determined location of the filament, where the result can include text and/or images. The processor 110 can further store the determined location of the filament in the memory 112.

The processor 110 can acquire the image 124 indicating an occurrence of photoemission (e.g., photoemission 108) on the resistive memory device 101. The processor 110 can further determine the location of a filament 105 in the switching medium 103 of the resistive memory device 101 using the acquired image 124. In an example, the image 124 can be acquired in response to a determination that the filament 105 is formed in the switching medium 103 of the resistive memory device 101. In an example, an amount of bias (e.g., bias voltage and/or bias current) can be applied to the resistive memory device 101 to form the filament 105 or to set or to reset the resistive memory device 101, or to read the state of the resistive memory device 101, or to stress the resistive memory device 101 at elevated voltage over time.

Figure 2:
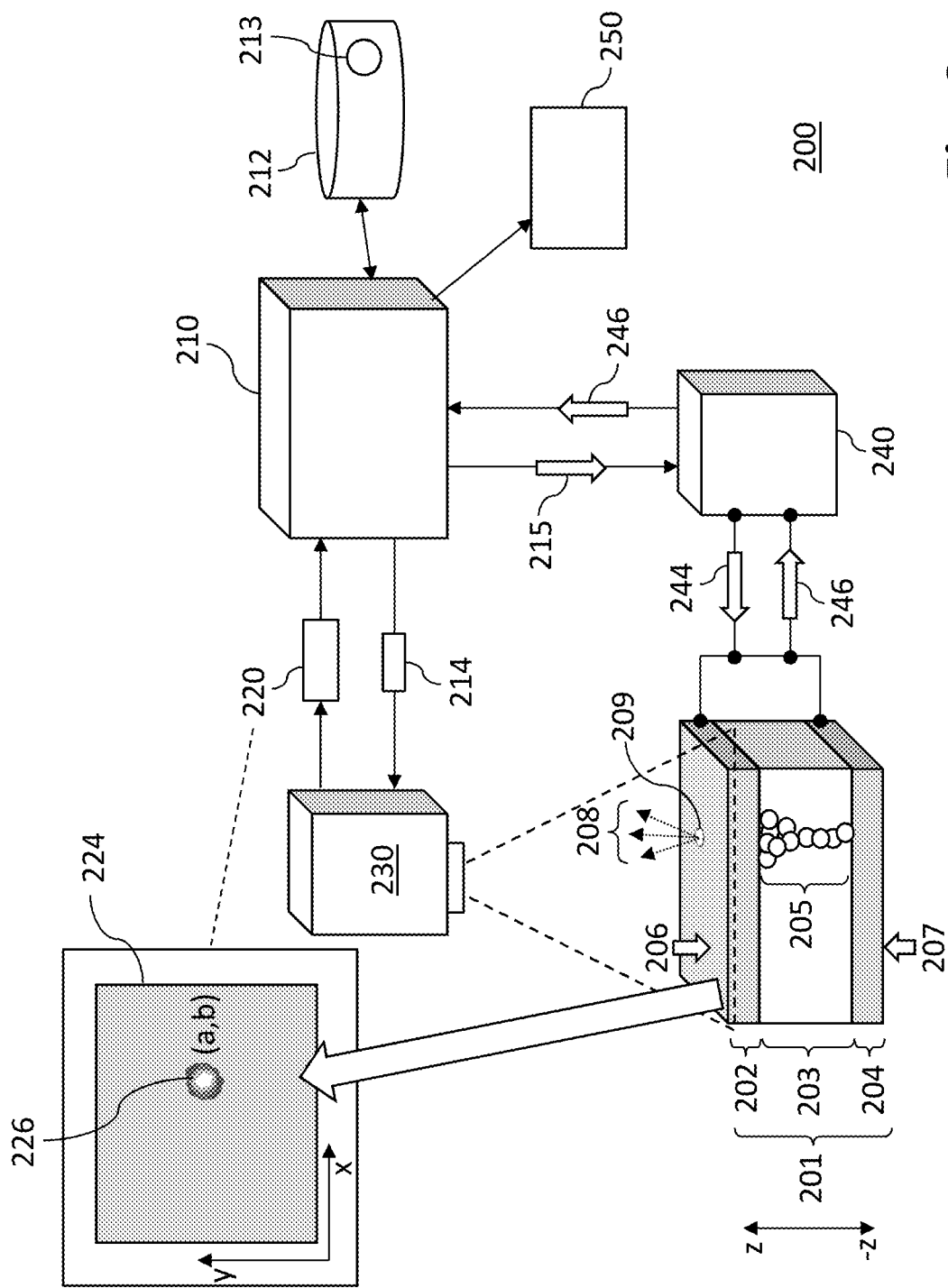
FIG. 2 is a diagram showing another example system that can implement RRAM filament location based on NIR emission in another embodiment.

FIG. 2 is a diagram showing an example system 200 that can implement RRAM filament location based on NIR emission in another embodiment. The system 200 can be implemented as an apparatus that can be utilized to form a filament in a switching medium of a resistive memory device 201 and to determine a location in the switching medium where the filament is formed. The resistive memory device 201 can be a resistive random access memory (RRAM) device. The system 200 can include a device 210, a memory 212, a device 230, and a device 240. The device 210 can be a processor or a controller of the apparatus implementing the system 200. The device 230 can be an optical device, such as a camera or microscope, configured to acquire light to generate images. The device 240 can be a meter or a source device, such as a bias supply device, configured to generate and output bias voltage and/or bias current, and to measure attributes such as resistance of source, such as a voltage source or a current source, resistive memory device 201. The device 210 can be configured to be in communication with the memory 212, the device 230, and the device 240. In some examples, the memory 212 can be a component of the device 210, such as being a memory device installed or embedded in the device 210. In some examples, the device 210 and the memory 212 can be components of a same computing device. The memory 212 can be configured to store a set of instructions 213. The device 210 can be configured to control operations of the device 230 and the device 240.

In an example, the device 230 can be a NIR camera or an NIR microscope configured to detect NIR emission that may occur on the resistive memory device 201. The device 230 can generate an image of at least a portion of the resistive memory device 201 based on the detected photoemission. The device 230 can generate data 220, where the data 220 can be image data that can be rendered into an image 224. The device 230 can send the data 220 to the device 210. In the example shown in FIG. 2, the image 224 can be an image of a surface 206 (e.g., top surface) of the resistive memory device 201. In some examples, the image 224 can be an image of another surface 207 (e.g., bottom surface) of the resistive memory device 201. In an example, the device 210 can send a control signal 214 to the device 230, where the control signal 214 can be a signal indicating whether to activate or deactivate the detection of NIR emission that may occur on the resistive memory device 201.

The resistive memory device 201 can include a first conductive element or electrode 202 and a second conductive element or electrode 204. A layer of switching medium 203 can be located or situated between the electrodes 202 and 204. The electrodes 202 and 204 can be made of conductive materials, such as various kinds of metals or alloy including rhodium, titanium, aluminum, copper, tungsten, iridium-ruthenium alloy, and/or other types of metal or conductive materials. The switching element 203 can be a layer of dielectric or insulating materials, such as layered amorphous silicon (a-Si), metal oxides, silicon oxides, Hafnium oxide ($HfO_x$), and/or other types of dielectric materials. It shall be apparent to a person of ordinary skill in the art that other materials can be used for forming the electrodes 202 and 204, and/or the switching medium 203.

In an example, the device 240 can apply a particular amount of voltage and/or current to the resistive memory device 201 to form a conductive filament (herein "filament") 205 in the switching medium 203. The formation of the filament 205 can cause the switching medium 203 to be conductive through a conductive path, such as the filament 205. Further, the formation of the filament 205 can cause the resistive memory device 201 to operate in a low resistance state. The filament 205 can be formed based on different mechanisms, such as vacancy or metal defect migration, and/or other mechanisms that can be triggered by the particular amount of voltage or current being applied to the resistive memory device. In an example, the resistive memory device 201 can be reset by breaking the filament 205, where breaking the filament 205, or the absence of the filament 205, can switch the resistive memory device 201 to operate in a high resistance state.

Further, the device 240 can be configured to apply a reverse bias (voltage or current) to the resistive memory device 201. In an example, a RRAM cell (e.g., resistive memory device 201) may require a forming step before it can be used as a switching memory device and before photoemission can be detected. Photoemission can be measured during the forming process as discussed in previous examples to study the process and the location of the filament. After forming, the RRAM device can be switched, such as being toggled between a low resistive state (set state) and high resistive state (reset) by applying an appropriate reverse or forward bias voltage or current. The two states (set or reset) have different resistivity but both states are much less resistive than an unformed device. Further, during the forming process, photoemission can also be acquired after forming by biasing the devices in forwards and reverse bias corresponding to set/reset states. This emission can be at the same spatial location (but not always) and can possibly have different characteristics such as different exponential dependencies (models) and/or emission spectra. Therefore, photoemission can be detected and acquired at specific bias points after some triggering event such as the forming jump, or the resistance change caused by reset/set switching. Also, photoemission can be acquired during voltage or current sweep and the emission spot changes in location or intensity can be analyzed.

In an example where the logic content (or state) of the RRAM memory cell needs to be kept secret or unknown. The detection of photoemission occurring on the RRAM device can provide indications of whether the RRAM device was previously formed or not. For example, an unformed RRAM cell may not emit photoemission under a "non-forming" voltage bias condition. Thus, if photoemission is detected from the RRAM memory device in response to the application of the reverse bias, then the RRAM memory device can be deemed as previously formed and its content or state might have been exposed. Further, photoemission intensity and/or spectrum may be a function of current state of the RRAM cell (e.g., set or reset) after forming. Therefore, one could use detected photoemission to determine the logic state of the RRAM cell and read the information out.

In the example shown in FIG. 2, the device 240 can apply a bias 244 to the resistive memory device 201, where the bias 244 can be one or more of a bias voltage and bias current. The device 240 can be configured to measure a resistance 246 of the resistive memory device 201. The device 240 can send the measured resistance 246 to the device 210. The device 210 can be configured to compare the resistance 246 with a resistance threshold that may be defined in the set of instructions 213. For example, if a resistance threshold $R_T$ is defined in the set of instructions 213, then the resistance 246 being less than $R_T$ can indicate that the resistive memory device 201 is operating in low resistance state, which means that the filament 205 may have been formed. In response to the resistance 246 being lower than $R_T$, the device 210 can send the control signal 214 to control the device 230 to acquire the image 224. In another example, the resistance 246 being greater than RT can indicate that the resistive memory device 201 is operating in high resistance state, which means that the filament 205 has yet to be formed. In response to the resistance 246 being greater than RT, the device 210 can send a control signal 215 to control the device 240 to increase the amount of bias 244 being applied to the resistive memory device 201.

In an example, photoemission 208 (e.g., photoemission in NIR range) can occur on one or more surfaces of the resistive memory device 201 in response to the formation of the filament 205. The photoemission 108 can be photoemission of various ranges, such as near-infrared (NIR), mid-infrared, infrared, visible, and/or other ranges. The carriers moving from one electrode to the opposite one (e.g., from element 202 to element 204, or from element 204 to element 202) along the formed or partially-formed filament 205 in the dielectric medium (e.g., switching medium 203) can produce a spontaneous photoemission under certain conditions of device operations, which include voltage across the device and current flowing in the device. The intensity and spectrum of the emission may depend on the bias conditions, for example, higher currents and higher voltages can produce higher emission intensity. In some case, the emission intensity can increase linearly with the current in the cell and exponentially with the applied voltage. The spontaneous photoemission can pass though one of the electrodes (e.g., top electrode or element 202 for front side measurements) and be measured with visible, NIR or thermal cameras or microscopes.

In the example shown in FIG. 2, the image 224 can be an image of the surface 206 after the filament 205 is formed. Based on the formation of the filament 205, the image 224 can include a photoemission intensity map (grey scale of false colors) exclusively or in combination with a photography of the RRAM device (e.g., resistive memory device 101) acquired, for example, by illuminating the sample and measuring the intensity of the reflected light. The photoemission intensity map, acquired in the dark, can allow one to detect the spontaneous emission from the filament 105 during appropriate/controlled bias/operating conditions. The pattern image can allow one to localize the active area of the RRAM device and determine the position of any spontaneous photoemission spot in the previous image relative to the device geometry, such as the cell center or perimeter. A relatively "bright" photoemission spot ("spot") 226 at a location (a, b) on a 2-dimensional image space, such as an x-y plane, shown in FIG. 2. The emission image 224 can include different shades, pixel values, and/or intensity, where the spot 226 can be a visual indicator in the image 224 that indicates the occurrence of the photoemission 208. The location (a, b) of the pattern 226 in the image 224 can correspond to the location 209 on the surface 206 of the resistive memory device 201. The device 210 can receive the data 220 that includes the image 224, and can execute the set of instructions 213 stored in the memory 212 to determine a location where the filament 205 is formed in the switching medium 203. For example, the device 210 can determine that the spot 226 is located at the location (a, b) in the image 224, and can determine that the filament 205 is formed in the switching medium 203 below (e.g., in the −z direction shown in FIG. 2) the location 209 of the surface 206. In some examples, the set of instructions 213 can include image processing algorithms such as edge detection, feature extraction, pattern recognition, image filters, and/or other types of image processing algorithms. The processor 210 can be configured to execute one or more of the image processing algorithms among the set of instructions 213 to determine the location of the spot or pattern 226 in the image 224. In some examples, the device 210 can display a result indicating the determined location of the filament, where the result can include text and/or images. The device 210 can further store the determined location of the filament in the memory 212.

In an example, the system 200 can also be implemented to monitor filament location over time. For example, the device 240 can apply a constant voltage or a ramp voltage on a plurality of RRAM devices. The controller 210 can repeatedly measure the emission from the RRAM devices over time, and based on the repeated measurements, the controller can determine plot the formation location of the filament on the different RRAM devices over time. In an example, a constant or varying (e.g., ramp or saw tooth, staircase, pulsed) bias can be applied to the RRAM cell over time. The bias could be a voltage or current. During such process, photoemission can occur with a fixed or variable acquisition frame rate. This can be achieved by starting a movie acquisition before the bias is started or by synchronizing individual time-integrated photoemission measurements at predetermined time intervals or specific events, such voltage steps. At each emission frame the filament photoemission spatial location and intensity can be determined as discussed. The location and intensity of the filament photoemission can then be plotted and/or analyzed in correlation to the specific bias conditions applied overtime. For example, a pulsed voltage can be applied to the RRAM cell with a relatively slowly increasing amplitude. Each step duration can be pre-determined to achieve specific goals. The corresponding current in the cell can be electrically measured. A photoemission movie with a fixed framerate can begin before the pulsed voltage ramp. Each movie frame can be analyzed during or after the process to determine the location of the filament at all or specific times. The intensity of the filament photoemission overtime can show that the emission intensity changes in intensity during the process of applying the pulsed voltage over time.

In another example, additional optical devices, such as cameras different from the device 230, with different spectral sensitivity, can be used to acquire different images of the resistive memory device 201. Some examples of cameras with different sensitivity can include charge coupled devices (CCD), indium gallium arsenide (InGaAs) cameras, mercury-cadmium-telluride (MCT) based cameras, Indium Antimonide (InSb) cameras, and/or other types of cameras. The different images can be used by the device 210 to determine energy levels of the electron carriers being emitted, and therefore the electric field at the filament location. In some examples, a hot-carrier model can be used to infer the energy of the electron carriers from the spectral distribution of the emitted light. Further, filament information can be deduced from the electric field associated with the spectral distribution.

In brief, the device 230 can be configured to generate the image 224, where the image 224 can indicate an occurrence of photoemission (e.g., photoemission 208) on the resistive memory device 201. The device 210 can be configured to acquire the image generated by the device 130. The controller can be further configured to determine the location of the filament 205 in the switching medium 203 of the resistive memory 201 device using the acquired image 224. The device 240 can be configured to apply an amount of bias 244 (e.g., bias voltage and/or bias current) to the resistive memory device 201. The device 240 can be further configured to measure a resistance 246 of the resistive memory device 201. The device 240 can be further configured to send the measured resistance 246 to the device 210. The device 210 can receive the measured resistance 246 from the device 240. The device 210 can determine a resistive state of the resistive memory device 201 based on the measured resistance 246. In an example, in response to the resistive state indicating that the filament 205 is formed in the switching medium 203 of the resistive memory device 201, the device 210 can control the device 230 to generate the image 224. In another example, in response to the resistive state indicating that the filament 205 is not formed in the switching medium 203 of the resistive memory device 201, the device 210 can control the device 140 to increase the amount of bias 144 being applied to the resistive memory device 201 to form the filament 205 or to set or to reset the resistive memory device 201, or to read the state of the resistive memory device 201, or to stress the resistive memory device 201 at elevated voltage over time.

Figure 3:
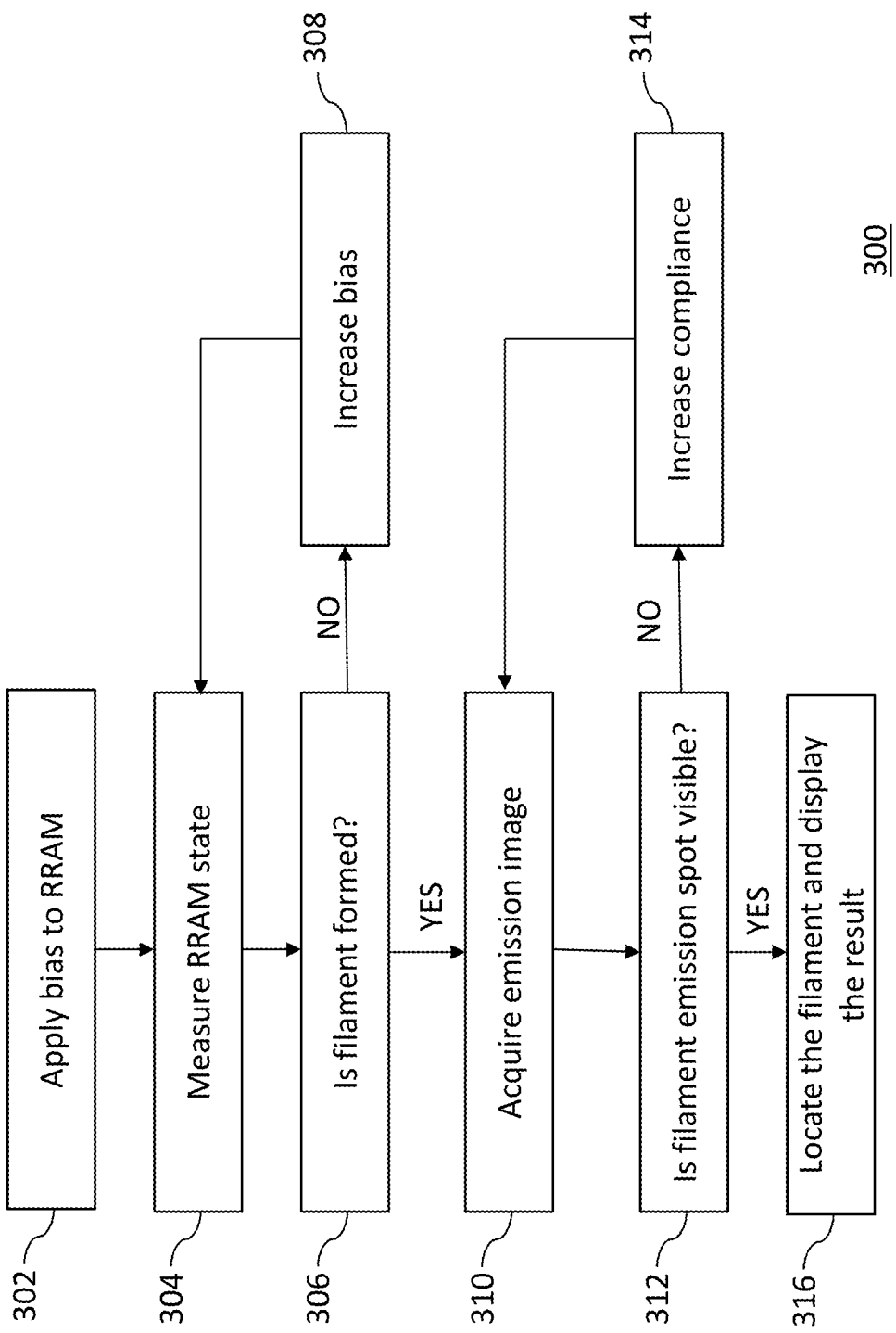
FIG. 3 is a flow diagram illustrating a process of implementing RRAM filament location based on NIR emission in one embodiment.

FIG. 3 is a flow diagram illustrating a process 300 to implement RRAM filament location based on NIR emission in one embodiment. The process 300 can include one or more operations, actions, or functions as illustrated by one or more of blocks 302, 304, 306, 308, 310, 312, 314, and/or 316. Although illustrated as discrete blocks, various blocks can be divided into additional blocks, combined into fewer blocks, eliminated, or performed in parallel, depending on the desired implementation.

The process 300 can begin at block 302. At block 302, a bias supply device (e.g., device 240 shown in FIG. 2) can apply an amount of bias voltage and/or bias current to a resistive random access memory (RRAM) device (e.g., resistive memory device 101 or resistive memory device 201 shown in FIG. 1 and FIG. 2, respectively). The process 300 can continue from block 302 to block 304. At block 304, the bias supply device and a controller (e.g., processor 110 or device 210 shown in FIG. 1 and FIG. 2, respectively) can facilitate a measurement of a RRAM state of the RRAM device. For example, the bias supply device can measure a resistance of the RRAM device, and the controller can determine whether the measured resistance corresponds to a low resistive state or a high resistive state of the RRAM device.

The process 300 can continue from block 304 to block 306. At block 306, the controller can determine whether a conductive filament is formed in a switching medium of the RRAM device. For example, the controller can compare the measured resistance with a defined threshold. If the measured resistance is greater than the defined threshold, then the controller can determine that the RRAM device is in the high resistive state and no filament was formed, and the process 300 can proceed to block 308. If the measured resistance is less than the defined threshold, then the controller can determine that the RRAM device is in the low resistive state and the filament was formed, and the process 300 can proceed to block 310.

At block 308, the controller can send a control signal to the bias supply device to increase the amount of bias voltage or bias current being applied to the RRAM device. The increased amount of bias voltage or bias current can be predefined as relatively small increment values, and can be based on a desired implementation of a system or an apparatus performing the process 300. Upon applying the increased amount of bias to the RRAM device, the process 300 can return to block 304 where the bias supply device can re-measure the resistance of the RRAM device. The controller can determine whether the filament is formed based on the updated measured resistance. The blocks 304, 306, 308 can be performed repeatedly until the controller determines that the filament is formed in the switching medium of the RRAM device.

At block 310, the controller can send a control signal to an optical device (e.g., device 230 shown in FIG. 2), such as an NIR camera or an NIR microscope, to control the optical device to acquire an emission image. The emission image can be an image illustrating a portion of the RRAM device. In response to the formation of the filament in the switching medium of the RRAM device, NIR emission can occur on one or more locations of the RRAM device. For example, NIR emission can occur on one or more of the electrodes stacked on a top and bottom of the switching medium. The emission image can include a visual indicator or spot that illustrates the occurrence of the NIR emission on the RRAM device.

The process 300 can continue from block 310 to block 312. At block 312, the controller can determine whether the emission spot, or the visual indicator, is visible in the acquired image. The controller can implement one or more image processing algorithms to determine whether the emission spot is visible in the image. If the emission spot is visible in the image, the process can proceed to block 316, where the controller can determine a spatial location of the emission spot in the image and output or display a result indicating the determined spatial location and/or the emission location on the RRAM device.

If the emission spot is not visible in the image acquired in block 310, the process 300 can proceed from block 312 to block 314. At block 314, the controller can increase a compliance of the RRAM device. In an example, the compliance of the RRAM device can refer to the maximum current that the instrument used to provide the bias is allowing before clamping. The compliance can be kept sufficiently low to avoid thermal damage to the device. Before forming, the current can be significantly lower than the compliance (max limit). Upon forming, the current can reach compliance and the current can be limited to avoid potentially dangerous situations. In some examples, during photoemission, the compliance value can be relaxed to allow more current flow. After each compliance increase, the actual device current may reach a new value that can be below or equal the new compliance value. Upon increasing the current compliance of the RRAM device, the process 300 can return to block 310, where the controller can control the optical device to acquire an updated image. The process 300 can return to block 312, where the controller can determine whether the emission spot is visible or not visible in the updated image. The blocks 310, 312, 314 can be performed repeatedly until the controller determines that the emission spot is visible in the acquired image.

Figure 4:
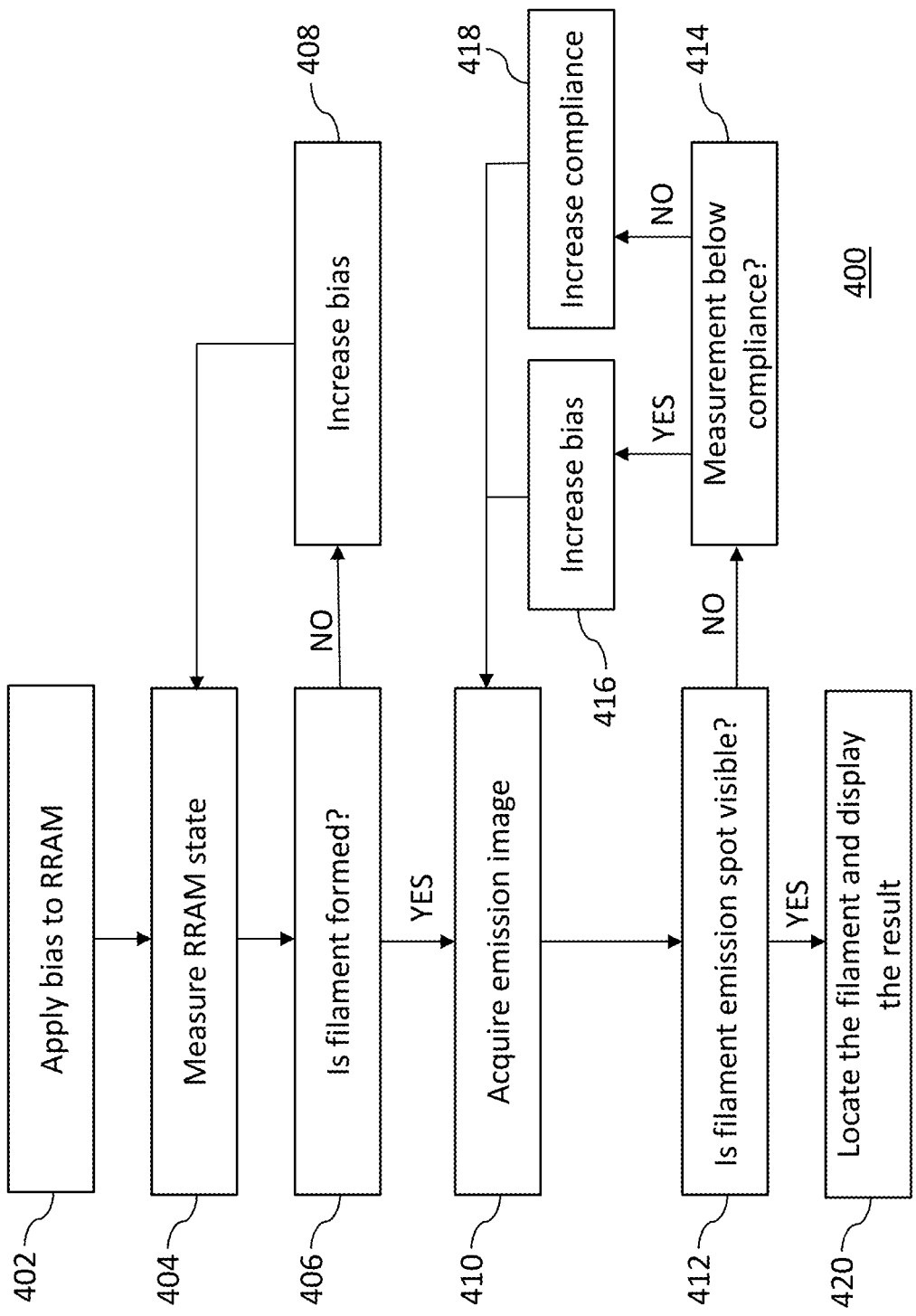
FIG. 4 is a flow diagram illustrating another process of implementing RRAM filament location based on NIR emission in one embodiment.

FIG. 4 is a flow diagram illustrating another process of implementing RRAM filament location based on NIR emission in one embodiment. The process 400 can include one or more operations, actions, or functions as illustrated by one or more of blocks 402, 404, 406, 408, 410, 412, 414, 416, 418, and/or 420. Although illustrated as discrete blocks, various blocks can be divided into additional blocks, combined into fewer blocks, eliminated, or performed in parallel, depending on the desired implementation.

The process 400 can begin at block 402. At block 402, a bias supply device (e.g., device 240 shown in FIG. 2) can apply an amount of bias voltage and/or bias current to a resistive random access memory (RRAM) device (e.g., resistive memory device 101 or resistive memory device 201 shown in FIG. 1 and FIG. 2, respectively). The process 400 can continue from block 402 to block 404. At block 404, the bias supply device and a controller (e.g., processor 110 or device 210 shown in FIG. 1 and FIG. 2, respectively) can facilitate a measurement of a RRAM state of the RRAM device. For example, the bias supply device can measure a resistance of the RRAM device, and the controller can determine whether the measured resistance corresponds to a low resistive state or a high resistive state of the RRAM device.

The process 400 can continue from block 404 to block 406. At block 406, the controller can determine whether a conductive filament is formed in a switching medium of the RRAM device. For example, the controller can compare the measured resistance with a defined threshold. If the measured resistance is greater than the defined threshold, then the controller can determine that the RRAM device is in the high resistive state and no filament was formed, and the process 400 can proceed to block 408. If the measured resistance is less than the defined threshold, then the controller can determine that the RRAM device is in the low resistive state and the filament was formed, and the process 400 can proceed to block 410.

At block 408, the controller can send a control signal to the bias supply device to increase the amount of bias voltage or bias current being applied to the RRAM device. The increased amount of bias voltage or bias current can be predefined as relatively small increment values, and can be based on a desired implementation of a system or an apparatus performing the process 400. Upon applying the increased amount of bias to the RRAM device, the process 400 can return to block 404 where the bias supply device can re-measure the resistance of the RRAM device. The controller can determine whether the filament is formed based on the updated measured resistance. The blocks 404, 406, 408 can be performed repeatedly until the controller determines that the filament is formed in the switching medium of the RRAM device.

At block 410, the controller can send a control signal to an optical device (e.g., device 230 shown in FIG. 2), such as an NIR camera or an NIR microscope, to control the optical device to acquire an emission image. The emission image can be an image illustrating a portion of the RRAM device. In response to the formation of the filament in the switching medium of the RRAM device, NIR emission can occur on one or more locations of the RRAM device. For example, NIR emission can occur on one or more of the electrodes stacked on a top and bottom of the switching medium. The emission image can include a visual indicator or pattern that illustrates the occurrence of the NIR emission on the RRAM device.

The process 400 can continue from block 410 to block 412. At block 412, the controller can determine whether the emission spot, or the visual indicator, is visible in the acquired image. The controller can implement one or more image processing algorithms to determine whether the emission spot is visible in the image. If the emission spot is visible in the image, the process can proceed to block 420, where the controller can determine a spatial location of the emission spot in the image and output or display a result indicating the determined spatial location and/or the emission location on the RRAM device.

If the emission spot is not visible in the image acquired in block 410, the process 400 can proceed from block 412 to block 414. At block 414, the controller can determine whether a current flowing through the RRAM device is below a current compliance of the RRAM device or not. For example, the actual current in the RRAM device can be compared to the current value of the instrument current compliance (e.g., an upper limit to the allowed device current). In response to the current being below the current compliance, the process 400 can proceed to block 416, where the controller can control the bias supply device to increase the bias voltage or bias current being applied to the RRAM device. In response to the current being above the current compliance, the process 400 can proceed to block 418, where the controller can increase the current compliance of the RRAM device. Upon increasing the bias or the current compliance of the RRAM device, the process 400 can return to block 410, where the controller can control the optical device to acquire an updated image. The process 400 can return to block 412, where the controller can determine whether the emission spot is visible or not visible in the updated image. The blocks 410, 412, 414, and 416 or 418, can be performed repeatedly until the controller determines that the emission spot is visible in the acquired image.

Figure 5:
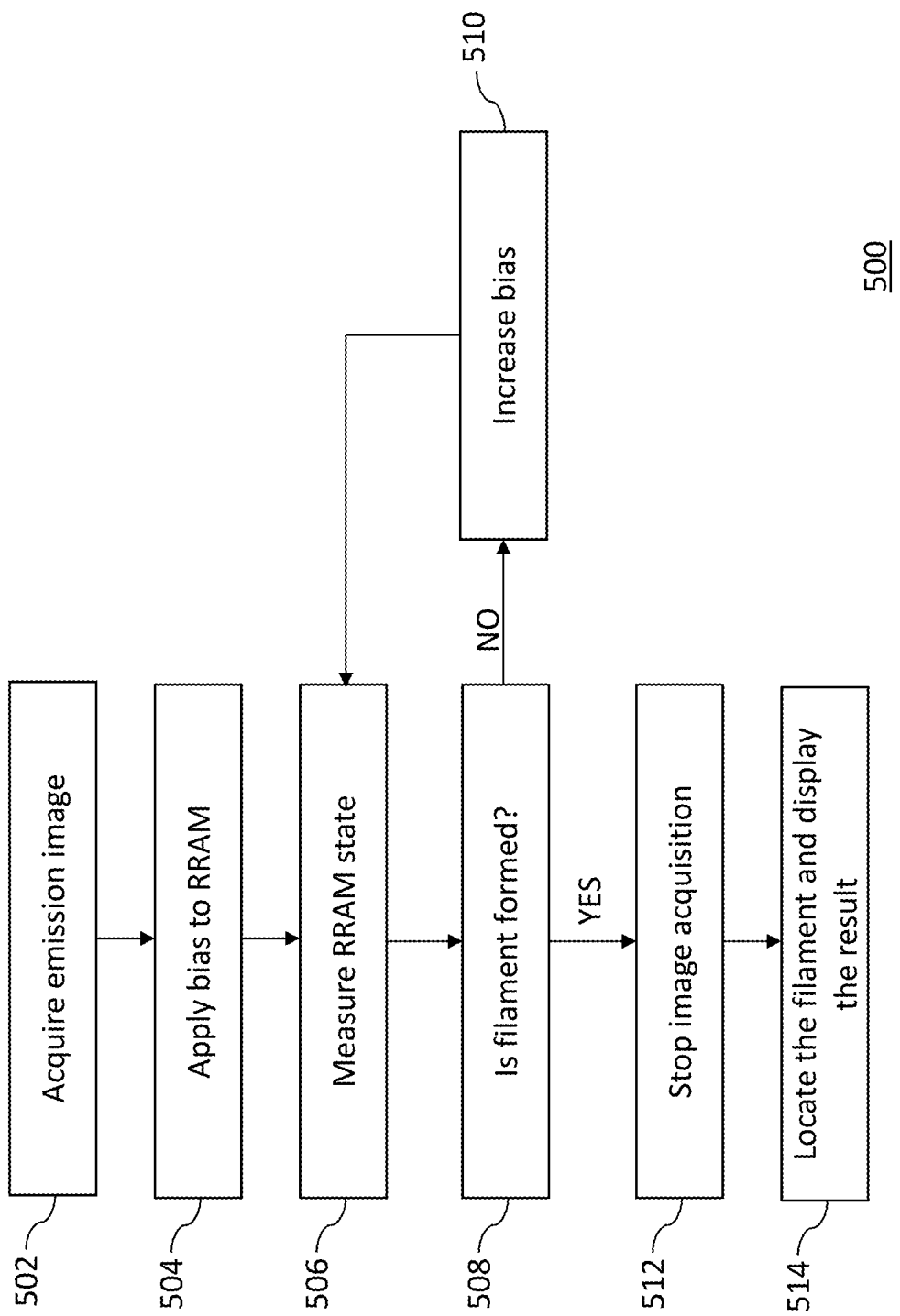
FIG. 5 is a flow diagram illustrating another process of implementing RRAM filament location based on NIR emission in one embodiment.

FIG. 5 is a flow diagram illustrating another process of implementing RRAM filament location based on NIR emission in one embodiment. The process 500 can include one or more operations, actions, or functions as illustrated by one or more of blocks 502, 504, 506, 508, 510, 512, and/or 514. Although illustrated as discrete blocks, various blocks can be divided into additional blocks, combined into fewer blocks, eliminated, or performed in parallel, depending on the desired implementation.

The process 500 can begin at block 502. At block 502, a controller (e.g., processor 110 or device 210 shown in FIG. 1 and FIG. 2, respectively) can send a control signal to an optical device (e.g., device 230 shown in FIG. 2), such as an NIR camera or an NIR microscope, to control the optical device to start or activate an image acquisition process to acquire an emission image. The emission image can be an image illustrating a portion of a RRAM device (e.g., resistive memory device 101 or resistive memory device 201 shown in FIG. 1 and FIG. 2, respectively). In an example, in response to a formation of a conductive filament in a switching medium of the RRAM device, NIR emission can occur on one or more locations of the RRAM device. For example, NIR emission can occur on one or more of the electrodes stacked on a top and bottom of the switching medium in response to the formation of the filament. The emission image can include a visual indicator or pattern that illustrates the occurrence of the NIR emission on the RRAM device if the filament is formed. The image acquisition process can remain activated to acquire a new emission image periodically, and until the controller stops the image acquisition process.

The process 500 can proceed from block 502 to block 504. At block 504, a bias supply device (e.g., device 240 shown in FIG. 2) can apply an amount of bias voltage and/or bias current to the resistive random access memory (RRAM) device. The process 500 can continue from block 504 to block 506. At block 506, the bias supply device and the controller can facilitate a measurement of a RRAM state of the RRAM device. For example, the bias supply device can measure a resistance of the RRAM device, and the controller can determine whether the measured resistance corresponds to a low resistive state or a high resistive state of the RRAM device.

The process 500 can continue from block 506 to block 508. At block 508, the controller can determine whether the conductive filament is formed in a switching medium of the RRAM device. For example, the controller can compare the measured resistance with a defined threshold. If the measured resistance is greater than the defined threshold, then the controller can determine that the RRAM device is in the high resistive state and no filament was formed, and the process 500 can proceed to block 510. If the measured resistance is less than the defined threshold, then the controller can determine that the RRAM device is in the low resistive state and the filament was formed, and the process 500 can proceed to block 512.

At block 510, the controller can send a control signal to the bias supply device to increase the amount of bias voltage or bias current being applied to the RRAM device. The increased amount of bias voltage or bias current can be predefined as relatively small increment values, and can be based on a desired implementation of a system or an apparatus performing the process 500. Upon applying the increased amount of bias to the RRAM device, the process 500 can return to block 506 where the bias supply device can re-measure the resistance of the RRAM device. The process can proceed from block 506 to block 508, where the controller can determine whether the filament is formed based on the updated measured resistance. The blocks 506, 508, 510 can be performed repeatedly until the controller determines that the filament is formed in the switching medium of the RRAM device.

At block 512, the controller can send a control signal to stop the image acquisition process being performed by the optical device. The process 500 can continue from block 512 to block 514. At block 514, the controller can determine a spatial location of an emission spot in the image acquired in block 502 and output or display a result indicating the determined spatial location and/or the emission location on the RRAM device.

Figure 6:
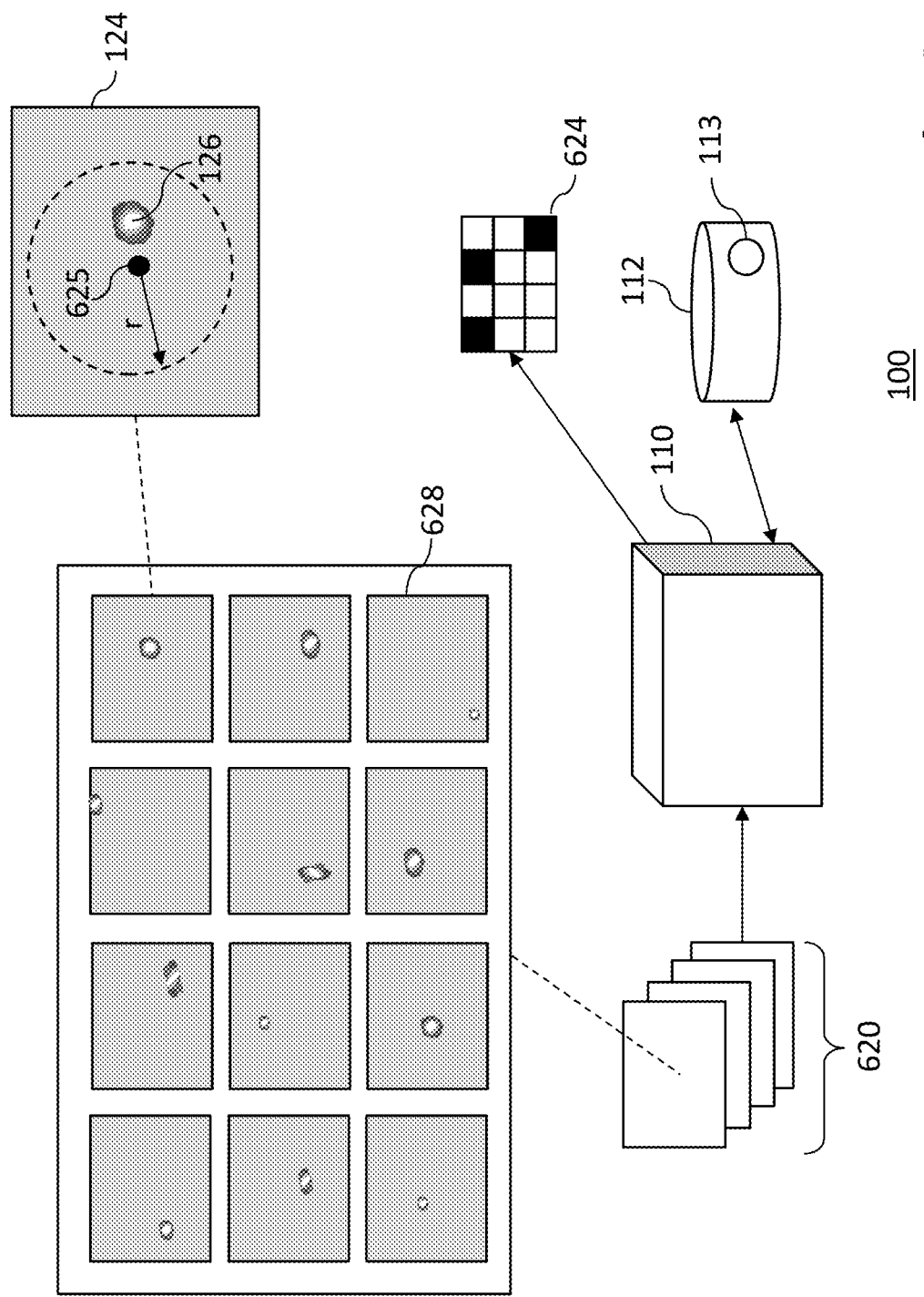
FIG. 6 is a diagram showing an example implementation of the system of FIG. 1 in one embodiment.

FIG. 6 is a diagram showing an example implementation of the system 100 of FIG. 1 in one embodiment. In the example shown in FIG. 6, the processor 110 can receive a plurality of images 620. The plurality of images 620 can include one or more images of a plurality of RRAM devices. For example, the image 124 can be an image of the RRAM shown in FIG. 1, and an emission image 628 can be an image of another RRAM. Each emission image among the plurality of images 620 can be different from each other. For example, the image 124 can include the indicator 126 showing an emission spot, and the image 628 may not include any indicator of emission spot. The processor 110 can search for visual indicators indicating emission spots for each image among the plurality of images 620. If a visual indicator is identified in an image, the processor 110 can determine whether the identified visual indicator is located at a desired location. For example, the processor 110 can identify a presence of the spot 126 in the image 124, and determine whether the spot 126 satisfies a location criterion, such as being located at a desired location.

In the example shown in FIG. 6, a reference point 625 can be defined by instructions 113 stored in the memory 112. The processor 110 can determine whether the pattern 126 is located within a distance r from the reference point 625. In response to the pattern 126 being located within the distance r, the processor 110 can determine that the filament 105 (shown in FIG. 1) being formed at the location 109 (shown in FIG. 1) is a desired location or not. Using the image 628 as another example, the processor 110 can identify a pattern that is located outside of the distance r from the reference point 625. In response to the pattern of image 628 being outside of the distance r from the reference point 625, the processor 110 can determine that a filament being formed on the RRAM corresponding to the image 628 is not at a desired location. The location of the reference point 625 and the distance r can be arbitrary, and can be dependent on a desired implementation of the system 100. Note that the example implementation shown in FIG. 6 can also be performed by the example system shown in FIG. 2.

The processor 110 can determine whether each RRAM among the plurality of RRAM devices shown as images 620 is at a desired location or not. Based on the determination of compliance, the processor 110 can generate a binary map 624. The binary map 624 can show a number of RRAM filaments that failed to form at desired locations. For example, a shaded box can indicate a RRAM that has a filament at an undesired location and an unshaded box can indicate a RRAM that has a filament at a desired location. The binary map 624 can be used by the processor 110 to determine a distribution of the filaments across an active area of a memory device having the plurality of RRAM devices by measuring their relative distance or their distance from a common reference point (e.g. center, edge, or corner). The processor 110 can also fit different types of statistical models to the binary map 624 to determine the type of filament distribution observed in the device.

The systems and methods described herein can be implemented to determine the spatial location (e.g., location in a 2-dimensional image plane) of a conductive filament formed in a switching medium of a RRAM device. The systems and methods described herein can be implemented with a practical application to locate the position of the filament during the formation process in a non-invasive and relatively quick approach, allowing measurements of a relatively large number of RRAM devices and to create statistics of the filament formation using relatively large amount of data Further, the systems and methods described herein can utilize optical inspection tools that may be readily available in scientific, diagnostic, and failure analysis laboratories.

Figure 7:
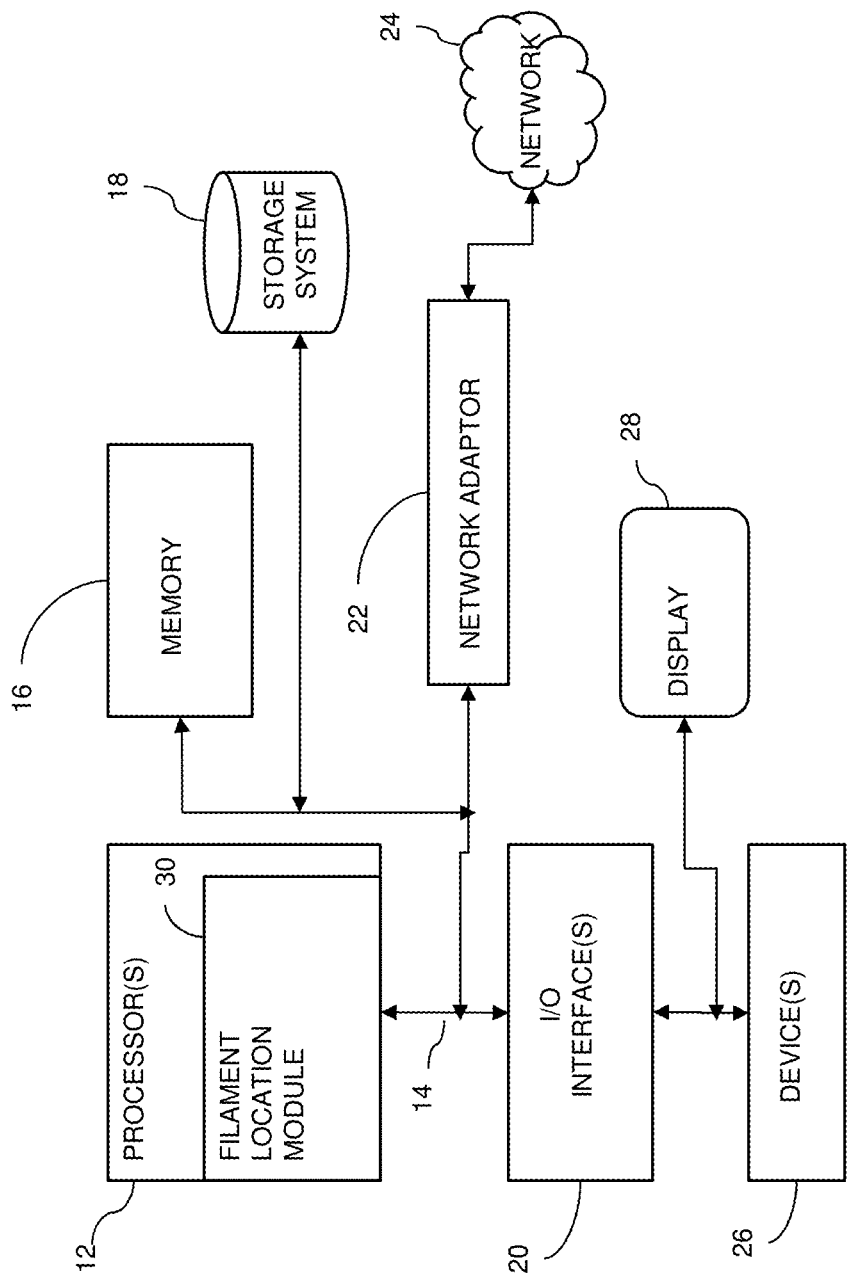
FIG. 7 illustrates a schematic of an example computer or processing system that may implement RRAM filament location based on NIR emission in one embodiment of the present disclosure.

FIG. 7 illustrates a schematic of an example computer or processing system that may implement RRAM filament location based on NIR emission in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 7 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, supercomputers, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include a module 30 (e.g., filament location module 30) that performs the methods described herein. The module 30 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   acquiring an image indicating an occurrence of photoemission from a resistive memory device; and
   determining a location of a filament in a switching medium of the resistive memory device using the acquired image.

2. The method of claim 1, wherein the photoemission is in near infrared (NIR) range.

3. The method of claim 1, wherein the image is acquired in response to a determination that the filament is formed in the switching medium of the resistive memory device.

4. The method of claim 1, wherein an amount of bias is applied to the resistive memory device to cause at least one of: form the filament, set the resistive memory device, reset the resistive memory device, read the state of the resistive memory device, and stress the resistive memory device at elevated voltage over time.

5. The method of claim 4, wherein the bias is at least one of a bias voltage and a bias current.

6. A system comprising:
   a memory configured to store a set of instructions;
   a processor configured to be in communication with the memory, the processor being configured to:
     acquire an image indicating an occurrence of photoemission from a resistive memory device; and
     execute the set of instructions stored in the memory to determine a location of a filament in a switching medium of the resistive memory device using the acquired image.

7. The system of claim 6, wherein the photoemission is in near infrared (NIR) range.

8. The system of claim 6, wherein the image is acquired in response to a receipt of a signal indicating the filament is formed in the switching medium of the resistive memory device.

9. The system of claim 6, wherein an amount of bias is applied to the resistive memory device to cause at least one of: form the filament, set the resistive memory device, reset the resistive memory device, read the state of the resistive memory device, and stress the resistive memory device at elevated voltage over time.

10. The system of claim 9, wherein the bias is at least one of a bias voltage and a bias current.

11. An apparatus comprising:
    an optical device configured to generate an image indicating an occurrence of photoemission on a resistive memory device;
    a controller configured to be in communication with the optical device, the controller being configured to:
      acquire the image generated by the optical device; and
      determine a location of a filament in a switching medium of the resistive memory device using the acquired image.

12. The apparatus of claim 11, wherein the photoemission is in near infrared (NIR) range.

13. The apparatus of claim 11, further comprising a meter configured to be in communication with the controller, the meter being configured to:
    apply an amount of bias to the resistive memory device;
    measure a resistance of the resistive memory device; and
    send the measured resistance to the controller.

14. The apparatus of claim 13, wherein the bias is at least one of a bias voltage and a bias current.

15. The apparatus of claim 13, wherein the controller is configured to:
    receive the measured resistance from the meter;
    determine a resistive state of the resistive memory device based on the measured resistance;

in response to the resistive state indicating that the filament is formed in the switching medium of the resistive memory device, control the optical device to generate the image; and in response to the resistive state indicating that the filament is not formed in the switching medium of the resistive memory device, control the meter to increase the amount of bias being applied to the resistive memory device to form the filament.

16. The apparatus of claim 15, wherein the controller is configured to:

determine whether a visual indicator representing the photoemission is present or absent in the image;

in response to the visual indicator being present in the image, determine the location of the visual indicator to determine the location of the filament; and in response to the visual indicator being absent from the image, increase a current compliance of the resistive memory device.

17. The apparatus of claim 15, wherein the controller is configured to:

determine whether a visual indicator representing the photoemission is present or absent in the image;

in response to the visual indicator being present in the image, determine the location of the visual indicator to determine the location of the filament;

in response to the visual indicator being absent from the image, determining whether a measured current of the resistive memory device is above or below a current compliance of the resistive memory device, and:

in response to the measured current being greater than the current compliance, control the meter to increase the amount of bias being applied to the resistive memory device;

in response to the measured current being less than the current compliance, increase a current compliance of the resistive memory device.

18. The apparatus of claim 11, wherein the resistive memory device is among a plurality of resistive memory devices, and the controller is configured to:

determine locations of filaments being formed in the plurality of resistive memory devices; and use the determined locations to generate a binary map indicating a number of resistive memory devices that satisfy a location criterion.

19. The apparatus of claim 18, wherein the resistive memory devices are determined to be in compliance based on filaments being formed at locations within a defined distance from a reference point.

20. The apparatus of claim 13, wherein;

the meter is further configured to apply a reverse bias to the resistive memory device;

in response to the application of the reverse bias, the controller is configured to:

control the optical device to acquire a new image of the resistive memory device with the applied reverse bias;

in response to the new image including an indication of photoemission, determine that another filament was formed in the switching medium of the resistive memory device previously; and in response to the new image excluding an indication of photoemission, determine that no filament was formed in the switching medium of the resistive memory device previously.

* * * * *